(12) United States Patent
Wu et al.

(10) Patent No.: US 10,262,938 B2
(45) Date of Patent: Apr. 16, 2019

(54) SEMICONDUCTOR STRUCTURE HAVING CONDUCTIVE LAYER OVERLAPPING FIELD OXIDE

(71) Applicant: Vanguard International Semiconductor Corporation, Hsinchu (TW)

(72) Inventors: Cheng-Tsung Wu, Taipei (TW); Shin-Cheng Lin, Tainan (TW); Yu-Hao Ho, Keelung (TW); Wen-Hsin Lin, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/692,641

(22) Filed: Aug. 31, 2017

(65) Prior Publication Data

US 2019/0067190 A1 Feb. 28, 2019

(51) Int. Cl.
*H01L 23/52* (2006.01)
*H01L 29/10* (2006.01)
*H01L 29/40* (2006.01)
*H01L 29/78* (2006.01)
*H01L 29/86* (2006.01)
(Continued)

(52) U.S. Cl.
CPC .......... *H01L 23/5228* (2013.01); *H01L 21/74* (2013.01); *H01L 23/5286* (2013.01); *H01L 28/24* (2013.01); *H01L 29/1083* (2013.01); *H01L 29/408* (2013.01); *H01L 29/66136* (2013.01); *H01L 29/66681* (2013.01);
(Continued)

(58) Field of Classification Search
CPC ............. H01L 23/5228; H01L 23/5286; H01L 23/53295; H01L 28/24; H01L 29/1083; H01L 29/408; H01L 29/66136; H01L 29/66681; H01L 29/7816; H01L 29/8611
See application file for complete search history.

(56) References Cited

U.S. PATENT DOCUMENTS 4,576,900 A * 3/1986 Chiang ............. H01L 21/76801
257/758
4,617,193 A * 10/1986 Wu .................... H01L 21/76838
216/18
(Continued)

FOREIGN PATENT DOCUMENTS

CN 105280612 A 1/2016

*Primary Examiner* — Ida M Soward
(74) *Attorney, Agent, or Firm* — Birch, Stewart, Kolasch & Birch, LLP

(57) ABSTRACT

A semiconductor structure including a substrate, a first well, a first doped region, a second well, a second doped region, a field oxide, a first conductive layer, a first insulating layer and a second conductive layer is provided. Each of the substrate and the second well has a first conductivity type. The first and second wells are formed in the substrate. The first well has a second conductivity type. The first doped region is formed in the first well and has the second conductivity type. The second doped region is formed in the second well and has the first conductivity type. The field oxide is disposed on the substrate and is disposed between the first and second doped regions. The first conductive layer overlaps the field oxide. The first insulating layer overlaps the first conductive layer. The second conductive layer overlaps the first insulating layer.

17 Claims, 16 Drawing Sheets

(51) Int. Cl.
  *H01L 23/522* (2006.01)
  *H01L 23/528* (2006.01)
  *H01L 49/02* (2006.01)
  *H01L 29/66* (2006.01)
  *H01L 29/861* (2006.01)
  *H01L 21/74* (2006.01)
  *H01L 23/532* (2006.01)

(52) U.S. Cl.
  CPC ...... *H01L 29/7816* (2013.01); *H01L 29/8611* (2013.01); *H01L 23/53295* (2013.01)

(56) References Cited

U.S. PATENT DOCUMENTS

| | | | | |
|---|---|---|---|---|
| 5,640,053 | A * | 6/1997 | Caldwell | H01L 23/544 257/641 |
| 5,702,982 | A * | 12/1997 | Lee | H01L 21/76808 257/E21.579 |
| 5,847,466 | A * | 12/1998 | Ito | H01L 24/03 257/775 |
| 5,888,905 | A * | 3/1999 | Taylor | H01L 21/312 257/E21.259 |
| 5,904,544 | A * | 5/1999 | Zommer | H01L 21/765 257/E23.151 |
| 6,031,267 | A * | 2/2000 | Lien | H01L 21/823878 257/344 |
| 6,103,601 | A * | 8/2000 | Lee | C23C 16/401 257/E21.241 |
| 6,110,831 | A * | 8/2000 | Cargo | B24B 37/013 257/E21.244 |
| 6,147,857 | A * | 11/2000 | Worley | H01L 23/5223 257/E23.153 |
| 6,190,948 | B1 * | 2/2001 | Seok | H01L 29/404 438/140 |
| 6,717,206 | B2 * | 4/2004 | Hsu | H01L 27/105 257/316 |
| 7,719,076 | B2 * | 5/2010 | Shu | H01L 29/0634 257/488 |
| 7,855,432 | B2 * | 12/2010 | Male | H01L 27/0802 257/536 |
| 7,955,943 | B2 * | 6/2011 | Hall | H01L 27/0288 257/E21.003 |
| 8,866,191 | B2 * | 10/2014 | Bahat-Treidel | H01L 29/404 257/192 |
| 8,878,330 | B2 * | 11/2014 | Kawahara | H01L 21/761 257/488 |
| 9,305,993 | B2 * | 4/2016 | Lin | G05F 3/02 |
| 9,331,143 | B1 * | 5/2016 | Tsai | H01L 29/0619 |
| 9,337,158 | B2 * | 5/2016 | Lin | H01L 27/0292 |
| 9,373,619 | B2 * | 6/2016 | Su | H01L 27/0802 |
| 9,806,189 | B2 * | 10/2017 | Kumano | H01L 29/7816 |
| 2002/0079521 | A1 * | 6/2002 | Lin | H01L 29/402 257/288 |
| 2003/0042499 | A1 * | 3/2003 | Reiner | H01L 27/0288 257/173 |
| 2003/0107102 | A1 * | 6/2003 | Ozeki | H01L 29/404 257/487 |
| 2004/0217415 | A1 * | 11/2004 | Mitros | H01L 27/115 257/316 |
| 2005/0161761 | A1 * | 7/2005 | Hatade | H01L 27/088 257/487 |
| 2008/0042236 | A1 | 2/2008 | Seah | |
| 2011/0186928 | A1 * | 8/2011 | Ichikawa | H01L 29/78 257/344 |
| 2012/0091526 | A1 * | 4/2012 | Tang | H01L 29/1037 257/339 |
| 2012/0181629 | A1 * | 7/2012 | Su | H01L 29/404 257/409 |
| 2013/0161740 | A1 * | 6/2013 | Disney | H01L 29/405 257/339 |
| 2014/0077866 | A1 * | 3/2014 | Cheng | H01L 29/402 327/534 |
| 2014/0175526 | A1 * | 6/2014 | Hsieh | H01L 23/4824 257/288 |
| 2014/0284756 | A1 * | 9/2014 | Ono | H01L 23/58 257/488 |
| 2015/0115366 | A1 * | 4/2015 | Lee | H01L 27/0296 257/355 |
| 2015/0262990 | A1 * | 9/2015 | Kanda | H01L 29/402 257/337 |
| 2016/0118378 | A1 * | 4/2016 | Wu | H01L 29/402 327/534 |
| 2016/0260704 | A1 * | 9/2016 | Huo | H01L 27/0629 |
| 2017/0125582 | A1 | 5/2017 | Murukesan et al. | |
| 2018/0096985 | A1 * | 4/2018 | Weyers | H01L 27/0255 |
| 2018/0190815 | A1 * | 7/2018 | Zhang | H01L 21/8238 |

* cited by examiner

SEMICONDUCTOR STRUCTURE HAVING CONDUCTIVE LAYER OVERLAPPING FIELD OXIDE

BACKGROUND OF THE INVENTION

Field of the Invention

The invention relates to a semiconductor structure, and more particularly to a semiconductor structure comprising a stack structure.

Description of the Related Art

Generally, integrated circuits comprise many electronic elements. These electronic elements can be classified into two groups: active elements and inactive elements. The active elements comprise transistors. Additionally, the inactive elements comprise resistors, capacitors and inductors. A conventional integrated circuit utilizes metal wires to connect many independent electronic elements. However, this increases the size of the integrated circuit. Additionally, a conducting wire is utilized to connect two elements during the packaging process, raising the cost of the integrated circuit.

BRIEF SUMMARY OF THE INVENTION

In accordance with an embodiment, a semiconductor structure comprises a substrate, a first well, a first doped region, a second well, a second doped region, a field oxide, a first conductive layer, a first insulating layer and a second conductive layer. The substrate has a first conductivity type. The first well is formed in the substrate and has a second conductivity type. The first doped region is formed in the first well and has the second conductivity type. The second well is formed in the substrate and has the first conductivity type. The second doped region is formed in the second well and has the first conductivity type. The field oxide is disposed on the substrate and is disposed between the first and second doped regions. The first conductive layer overlaps the field oxide. The first insulating layer overlaps the first conductive layer. The second conductive layer overlaps the first insulating layer.

An exemplary embodiment of a method for manufacturing a semiconductor structure is described in the following. A substrate is provided and has a first conductivity type. A first well is formed in the substrate. The first well has a second conductivity type. A first doped region is formed in the first well. The first doped region has the second conductivity type. A second well is formed in the substrate. The second well has the first conductivity type. A second doped region is formed in the second well. The second doped region has the first conductivity type. A field oxide is formed on the substrate. The field oxide is disposed between the first and second doped regions. A first conductive layer is formed on the field oxide. A first insulating layer is formed on the first conductive layer. A second conductive layer is formed on the first insulating layer.

Another exemplary embodiment of a method for manufacturing a semiconductor structure is described in the following. A substrate is provided and has a first conductivity type. A first well is formed in the substrate. The first well has a second conductive layer. A first doped region is formed in the first well. The first doped region has the second conductive layer. A second well is formed in the substrate. The second doped region has the first conductive layer. A second doped region is formed in the second well. The second doped region has the first conductive layer. A third doped region is formed in the second well. The third doped region has the second conductive layer. A field oxide is formed on the substrate. The field oxide is disposed between the first and third doped regions. A gate is formed on the substrate and overlaps a portion of the field oxide and a portion of the second well. The gate, the first doped region, the second doped region and the third doped region constitute a transistor. The first doped region serves as the drain of the transistor. The second doped region serves as the bulk of the transistor. The third doped region serves as the source of the transistor. A first conductive layer is formed on the field oxide. The first conductive layer is spaced apart from the gate. A first insulating layer is formed on the first conductive layer. A second conductive layer is formed on the first insulating layer.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1A:
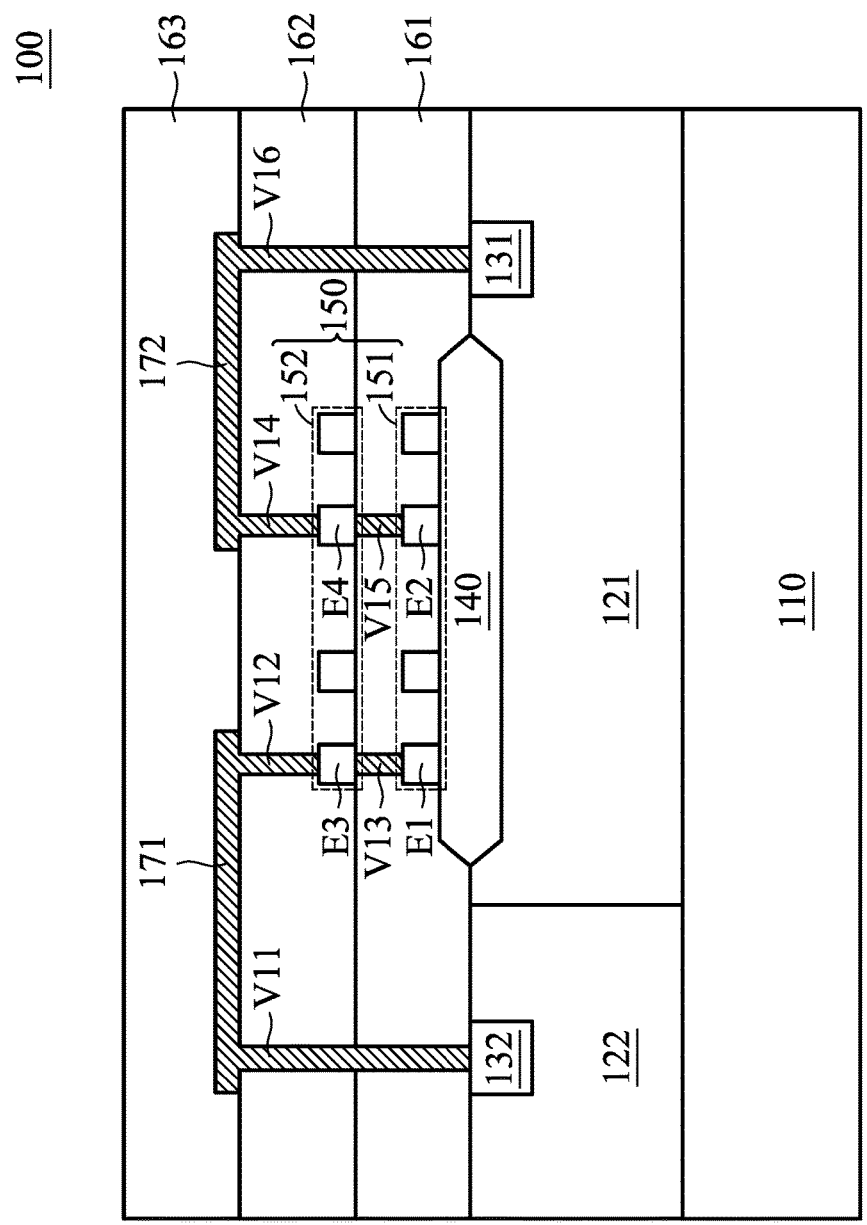
FIG. 1A is a schematic diagram of an exemplary embodiment of a semiconductor structure, according to various aspects of the present disclosure.

The semiconductor structure of the present disclosure and methods for manufacturing a semiconductor structure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the like and/or corresponding numerals in the drawings of different embodiments does not suggest any correlation between different embodiments. In addition, in this specification, expressions such as "first material layer disposed on/over a second material layer", may indicate not only the direct contact of the first material layer and the second material layer, but also, a non-contact state with one or more intermediate layers between the first material layer and the second material layer. In the above situation, the first material layer may not directly contact the second material layer.

FIG. 1A is a schematic diagram of an exemplary embodiment of a semiconductor structure, according to various aspects of the present disclosure. The semiconductor structure 100 comprises a substrate 110, wells 121 and 122, doped regions 131 and 132, a field oxide 140 and a stack structure 150. The substrate 110 has a first conductivity type. In one embodiment, the substrate 110, such as a silicon substrate, a silicon on insulator (SOI) substrate or another suitable semiconductor substrate, is provided.

The well 121 is formed in the substrate 110 and has a second conductivity type. In this embodiment, the second conductivity type is different from the first conductivity type. For example, the first conductivity type is P-type, and the second conductivity type is N-type. In another embodiment, the first conductivity type is N-type, and the second conductivity type is P-type. In some embodiments, the well 121 is a high-voltage well. The well 121 may be formed by ion implantation. For example, when the second conductivity type is N-type, the predetermined region for the well 121 may be implanted with phosphorous ions or arsenic ions to form the well 121. However, when the second conductivity type is P-type, the predetermined region for the well 121 may be implanted with boron ions or indium ions to form the well 121.

The well 122 is formed in the substrate 110 and has the first conductivity type. In one embodiment, the dopant concentration of the well 122 is higher than the dopant concentration of the substrate 110. In this embodiment, the well 122 contacts the well 121, but the disclosure is not limited thereto. In other embodiments, the well 121 is spaced apart from the well 122. The well 122 may be also formed by ion implantation. For example, when the first conductivity type is P-type, the predetermined region for the well 122 may be implanted with boron ions or indium ions to form the well 122. However, when the first conductivity type is N-type, the predetermined region for the well 122 may be implanted with phosphorous ions or arsenic ions to form the well 122.

The doped region 131 is formed in the well 121 and has the second conductivity type. In one embodiment, the doped region 131 is also formed by ion implantation. In this embodiment, the dopant concentration of the doped region 131 is higher than the dopant concentration of the well 121. In another embodiment, the doped region 131 serves as a cathode of a diode.

The doped region 132 is formed in the well 122 and has the first conductivity type. In one embodiment, the doped region 132 is also formed by ion implantation. In this embodiment, the dopant concentration of the doped region 132 is higher than the dopant concentration of the well 122. In another embodiment, the doped region 132 serves as an anode of the diode.

The field oxide 140 is disposed on the substrate 110 and disposed between the doped regions 131 and 132. In this embodiment, the field oxide 140 is extended into the well 121. As shown in FIG. 1A, the field oxide 140 is spaced apart from the doped region 131, but the disclosure is not limited thereto. In other embodiments, the field oxide 140 may be directly contact the doped region 131.

The stack structure 150 is formed on the field oxide 140 and contacts the field oxide 140. In this embodiment, the stack structure 150 at least comprises two conductive layers 151 and 152 and an insulating layer 161. As shown in FIG. 1A, the conductive layer 151 is formed on the field oxide 140 and directly contacts the field oxide 140. The material of the conductive layer 151 may include metal, metal oxide, metal nitride, metal alloy, metal silicide, and other suitable conductive material or a combination thereof. For example, the material of the conductive layer 151 is SiCr, metal or Poly. In other embodiments, the conductive layer 151 includes non-doped poly. In the present disclosure, the shape of the extended path of the conductive layer 151 is not limited. The conductive layer 151 is extended along a pre-determined direction which is maintained or is changed many times. For example, the conductive layer 151 is extended along a strip-shaped path, a curved-shaped path or a helical-shaped path. In this embodiment, the conductive layer 151 is equivalent to a first resistor. A designer adjusts the dopant concentration of the conductive layer 151 and the shape of the extended path of the conductive layer 151 to adjust the resistance of the first resistor.

The insulating layer 161 is formed on the wells 121 and 122, the doped regions 131 and 132, the field oxide 140 and the conductive layer 151. The insulating layer 161 is electrically isolated from the conductive layers 151 and 152. The material of the insulating layer 161 may include, oxide, nitride, oxynitride, low-k material, any other suitable insulation material, or a combination thereof. The insulating layer 161 may be formed by chemical vapor deposition (CVD).

The conductive layer 152 is formed on the insulating layer 161 and covers the conductive layer 151. The material of the conductive layer 152 may include metal, metal oxide, metal nitride, metal alloy, metal silicide, and other suitable conductive material or a combination thereof. For example, the material of the conductive layer 152 is SiCr, metal or Poly. In other embodiments, the conductive layer 152 also includes non-doped poly. In the present disclosure, the shape of the extended path of the conductive layer 152 is not limited. In one embodiment, the conductive layer 152 is extended along a strip-shaped path, a curved-shaped path or a helical-shaped path. In another embodiment, the shape of the extended path of the conductive layer 152 may be the same as or different from the shape of the extended path of the conductive layer 151. In this embodiment, the conductive layer 152 is equivalent to a second resistor. The resistance of the second resistor relates to the dopant concentration of the conductive layer 152 and the shape of the extended path of the conductive layer 152. In one embodiment, the resistance of the second resistor is different from or the same as the resistance of the first resistor.

Additionally, in other embodiments, when the voltage levels of the conductive layers 151 and 152 are the same, the capacitance of the equivalent capacitor formed by the conductive layer 151, the insulating layer 161 and the conductive layer 152 is approximately equal to 0. In other embodiments, the stack structure 150 is formed by more conductive layers and more insulating layers. For example, assume that the stack structure 150 comprises a first conductive layer, a second conductive layer and a third conductive layer. In this case, the first conductive layer directly contacts the field oxide 140. A first insulating layer is formed on the first conductive layer. Next, the second conductive layer is formed on the first insulating layer and overlaps the first conductive layer. Then, a second insulating layer is formed on the second conductive layer. Next, the third conductive layer is formed on the second insulating layer and overlaps the second conductive layer. For brevity, two conductive layers are given as an example.

Figure 1B:
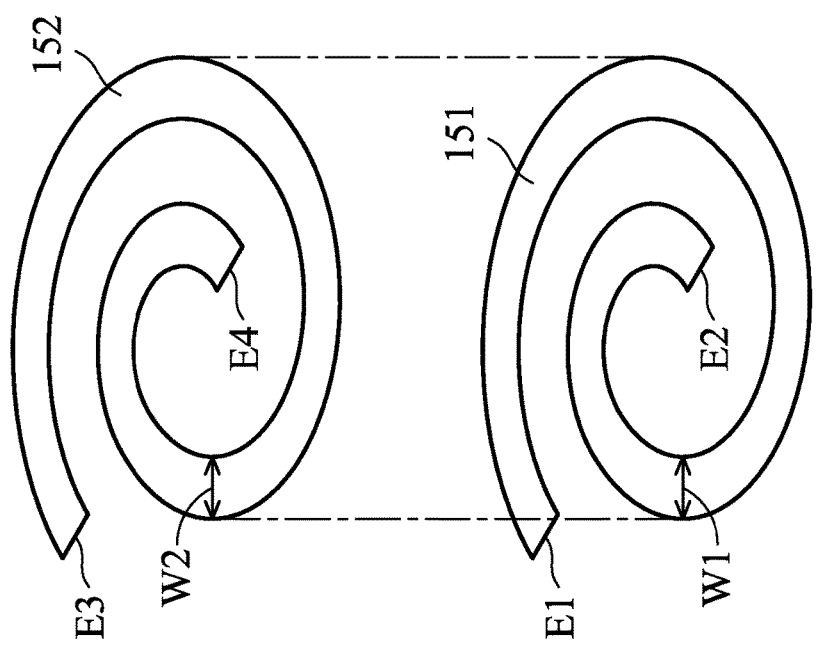
FIGS. 1B and 1C are plan views of exemplary embodiments of conductive layers shown in FIG. 1.
Figure 1C:
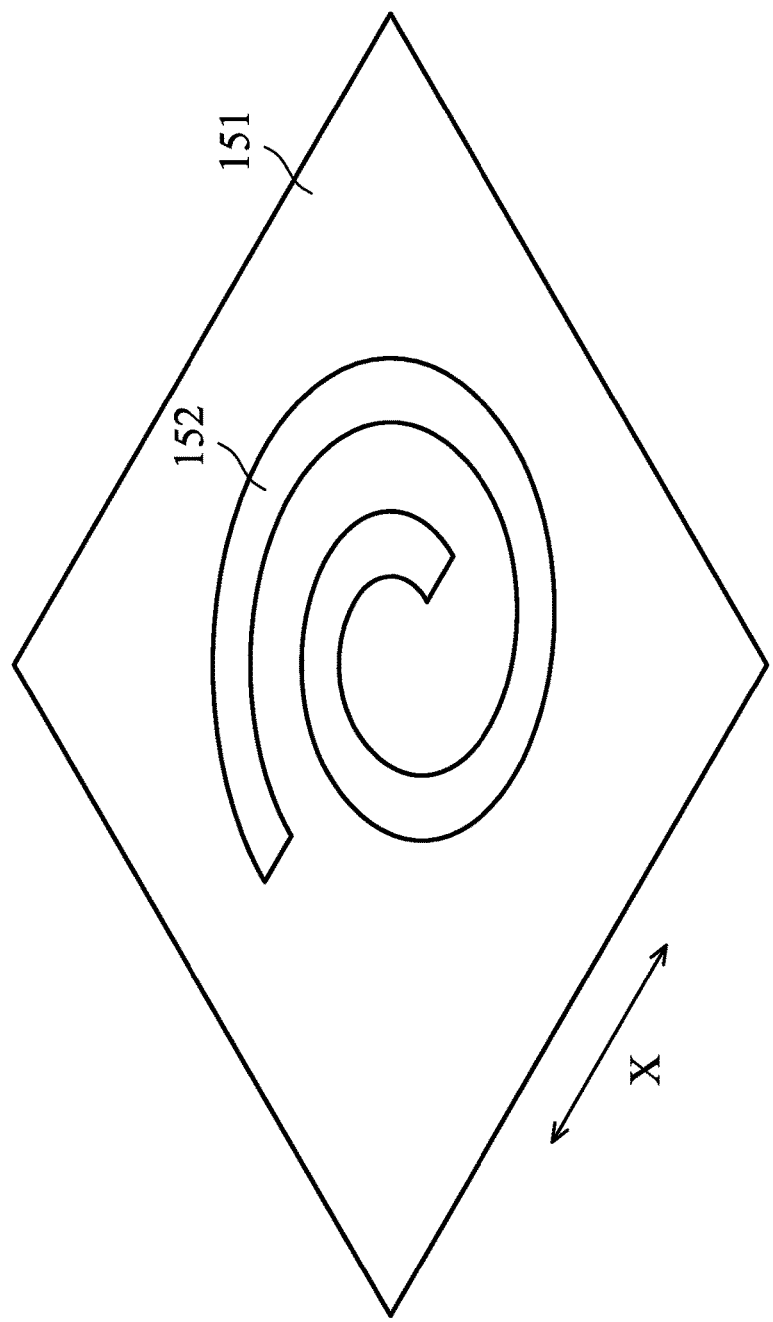

FIGS. 1B and 1C are top-views of exemplary embodiments of the conductive layers 151 and 152 shown in FIG. 1. In FIG. 1B, each of the conductive layers 151 and 152 is extended along a helical-shaped path. The conductive layer 151 comprises conductive terminals E1 and E2. The conductive layer 152 comprises conductive terminals E3 and E4. In one embodiment, the width W1 of the conductive layer 151 is about equal to the width W2 of the conductive layer 152, but the disclosure is not limited thereto. In other embodiments, the width W1 of the conductive layer 151 may be more than or less than the width W2 of the conductive layer 152.

In one embodiment, the conductive layer 151 completely covers the conductive layer 152 so that the conductive terminal E1 of the conductive layer 151 covers the conductive terminal E3 of the conductive layer 152, and the conductive terminal E2 of the conductive layer 151 covers the conductive terminal E4 of the conductive layer 152. In another embodiment, the conductive layer 151 does not completely cover the conductive layer 152. For example, the conductive layer 151 covers a portion of the conductive layer 152.

In other embodiments, the conductive terminal E1 of the conductive layer 151 incompletely or completely covers the conductive terminal E3 of the conductive layer 152. Furthermore, the conductive terminal E2 of the conductive layer 151 may incompletely or completely cover the conductive terminal E4 of the conductive layer 152. In FIG. 1B, the conductive terminal E1 of the conductive layer 151 completely covers the conductive terminal E3 of the conductive layer 152, and the conductive terminal E2 of the conductive layer 151 completely covers the conductive terminal E4 of the conductive layer 152.

In FIG. 1C, the shape of the extended path of the conductive layer 151 is different from the shape of the extended path of the conductive layer 152. In this embodiment, the extended path of the conductive layer 151 is a strip-shaped path extending along the direction X. However, the extended path of the conductive layer 152 is a helical-shaped path. The extended direction of the helical-shaped path is not fixed.

Referring to FIG. 1A, in one embodiment, the semiconductor structure 100 further comprises insulating layers 162 and 163 and conducting wires 171 and 172. The insulating layer 162 is formed on the insulating layer 161. The conducting wires 171 and 172 are formed on the insulating layer 162. The insulating layer 163 is formed on the conducting wires 171 and 172.

In this embodiment, the conducting wire 171 is electrically connected to the doped region 132, the conductive terminal E3 of the conductive layer 152 and the conductive terminal E1 of the conductive layer 151 via the vias V11~V13. The conducting wire 172 is electrically connected to the conductive terminal E4 of the conductive layer 152, the conductive terminal E2 of the conductive layer 151 and the doped region 131 via the vias V14~V16. In one embodiment, the conducting wire 172 is configured to transmit a ground level.

Figure 1D:
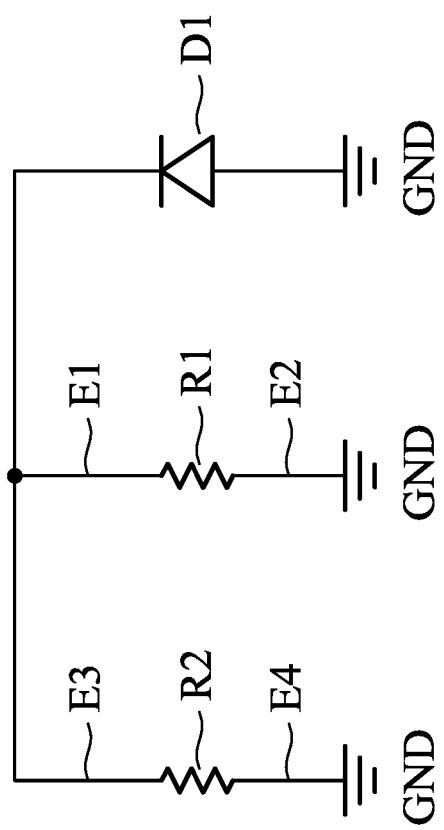
FIG. 1D is an equivalent circuit diagram of an exemplary embodiment of the semiconductor structure shown in FIG. 1A, according to an embodiment of the present invention.

FIG. 1D is an equivalent circuit diagram of an exemplary embodiment of the semiconductor structure 100 shown in FIG. 1A in accordance with another embodiment of the present disclosure. The semiconductor structure 100 comprises a diode D1 and resistors R1 and R2. Since the conducting wire 171 is electrically connected to the doped region 132, the conductive terminal E3 of the conductive layer 152 and the conductive terminal E1 of the conductive layer 151 and the conducting wire 172 is electrically connected to the conductive terminal E4 of the conductive layer 152, the conductive terminal E2 of the conductive layer 151 and the doped region 131, the diode D1 and the resistors R1 and R2 are connected in parallel, but the disclosure is not limited thereto. In the present invention, the connection relationship between the diode D1 and the resistors R1 and R2 is not limited. In other embodiments, one of the diode D1 and the resistors R1 and R2 may connect to another of the diode D1 and the resistors R1 and R2 in series.

In this embodiment, the doped region 131 shown in FIG. 1A serves as the cathode of the diode D1 and the doped region 132 shown in FIG. 1A serves as the anode of the diode D1. Furthermore, the resistor R1 shown in FIG. 1D represents the equivalent resistor of the conductive layer 151. The resistor R2 shown in FIG. 1D represents the equivalent resistor of the conductive layer 152.

Figure 2A:
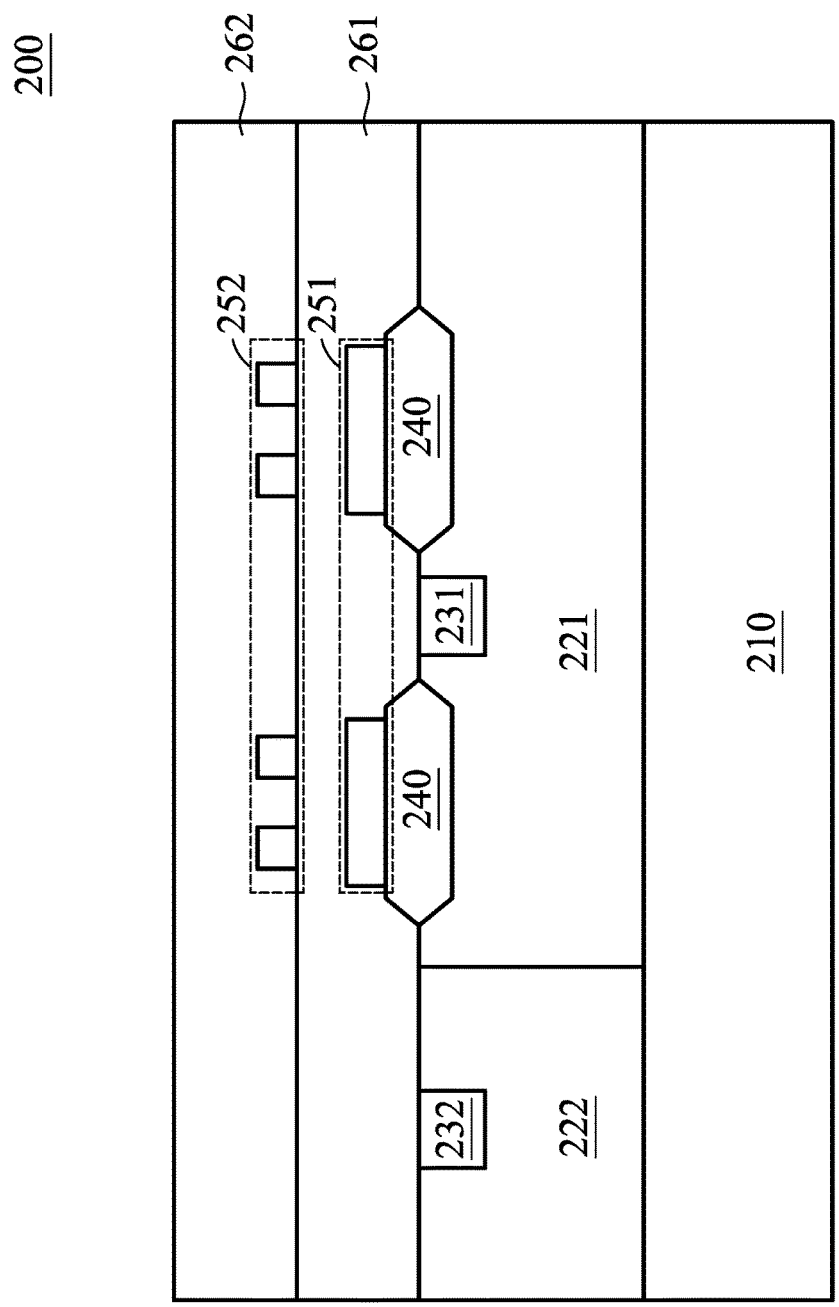
FIG. 2A is a schematic diagram of another exemplary embodiment of the semiconductor structure, according to various aspects of the present disclosure.

FIG. 2A is a schematic diagram of another exemplary embodiment of the semiconductor structure, according to various aspects of the present disclosure. The semiconductor structure 200 comprises a substrate 210, wells 221 and 222, the doped regions 231 and 232, a field oxide 240, conductive layers 251 and 252, and insulating layers 261 and 262. In this embodiment, the field oxide 240 is extended along a ring path surrounding the doped region 231. Furthermore, the shape of the extended path of the conductive layer 251 is different from the shape of the extended path of the conductive layer 252. In this embodiment, the extended path of the conductive layer 251 is a ring-shaped path, and the extended path of the conductive layer 252 is a helical-shaped path. Since the features of the substrate 210, the wells 221 and 222, the doped regions 231 and 232, the field oxide 240, the conductive layers 251 and 252, and the insulating layers 261 and 262 are the same as the features of the substrate 110, the wells 121 and 122, the doped regions 131 and 132, the field oxide 140, the conductive layers 151 and 152, and the insulating layers 161 and 162 of the semiconductor structure 100, the descriptions of the substrate 210, the wells 221 and 222, the doped regions 231 and 232, the field oxide 240, the conductive layers 251 and 252, and the insulating layers 261 and 262 are omitted.

Figure 2B:
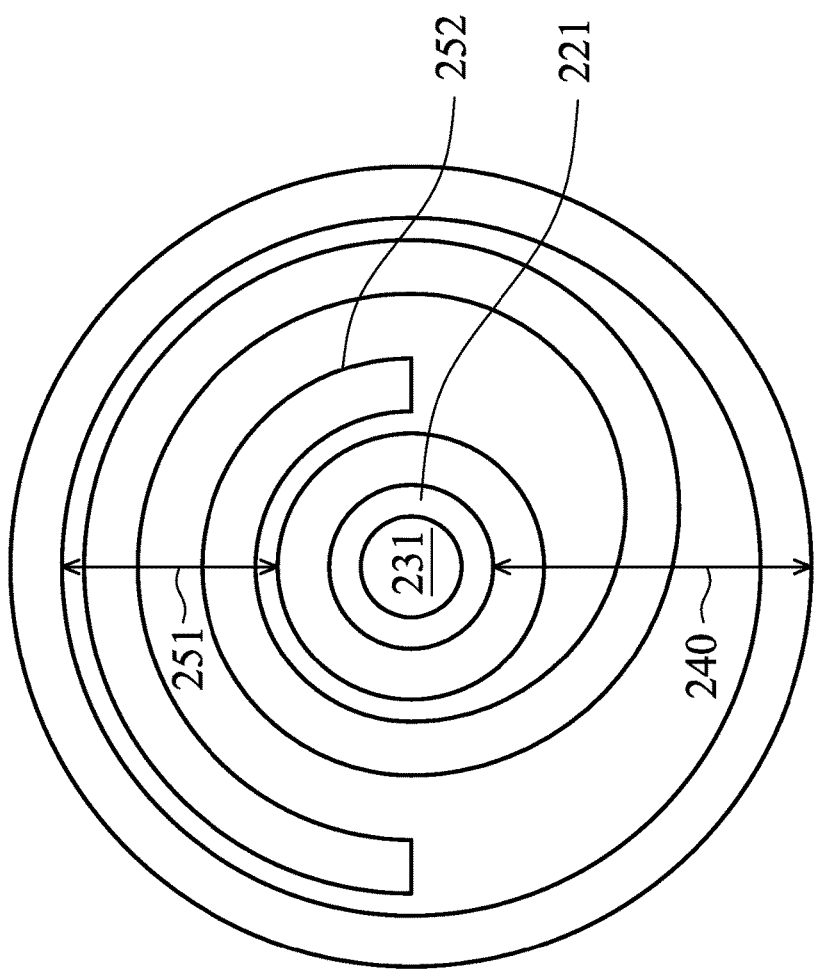
FIG. 2B is a plan view of exemplary embodiments of the field oxide shown in FIG. 2A.

FIG. 2B is a top-view of exemplary embodiments of the field oxide shown in FIG. 2A. the extended path of the field oxide 240 is a ring path surrounding the doped region 231. In this embodiment, the extended path of the doped region 231 is a circular path. Additionally, the extended path of the conductive layer 251 is also a ring path overlapping the field oxide 240. In this case, the extended path of the conductive layer 252 is a helical path overlapping the conductive layer 251. In other embodiments, the extended path of the conductive layer 251 is a helical path, and the extended path of the conductive layer 252 is a ring path. In some embodiments, the extended paths of the conductive layers 251 and 252 are helical paths shown in FIG. 1B or the extended paths of the conductive layers 251 and 252 are ring paths.

In the present disclosure, the shapes of the extended paths of the conductive layers 251 and 252 are not limited. The shape of the extended path of the conductive layer 251 may be the same as or different from the shape of the extended path of the conductive layer 252. Additionally, when the shapes of the extended paths of the conductive layers 251 and 252 are the same, the area of the conductive layer 251 may be the same as or different from the area of the conductive layer 252. Furthermore, when the shapes of the extended paths of the conductive layers 251 and 252 are the same, the conductive layer 251 may completely cover the conductive layer 252 or it may cover only a portion of the conductive layer 252.

Figure 3A:
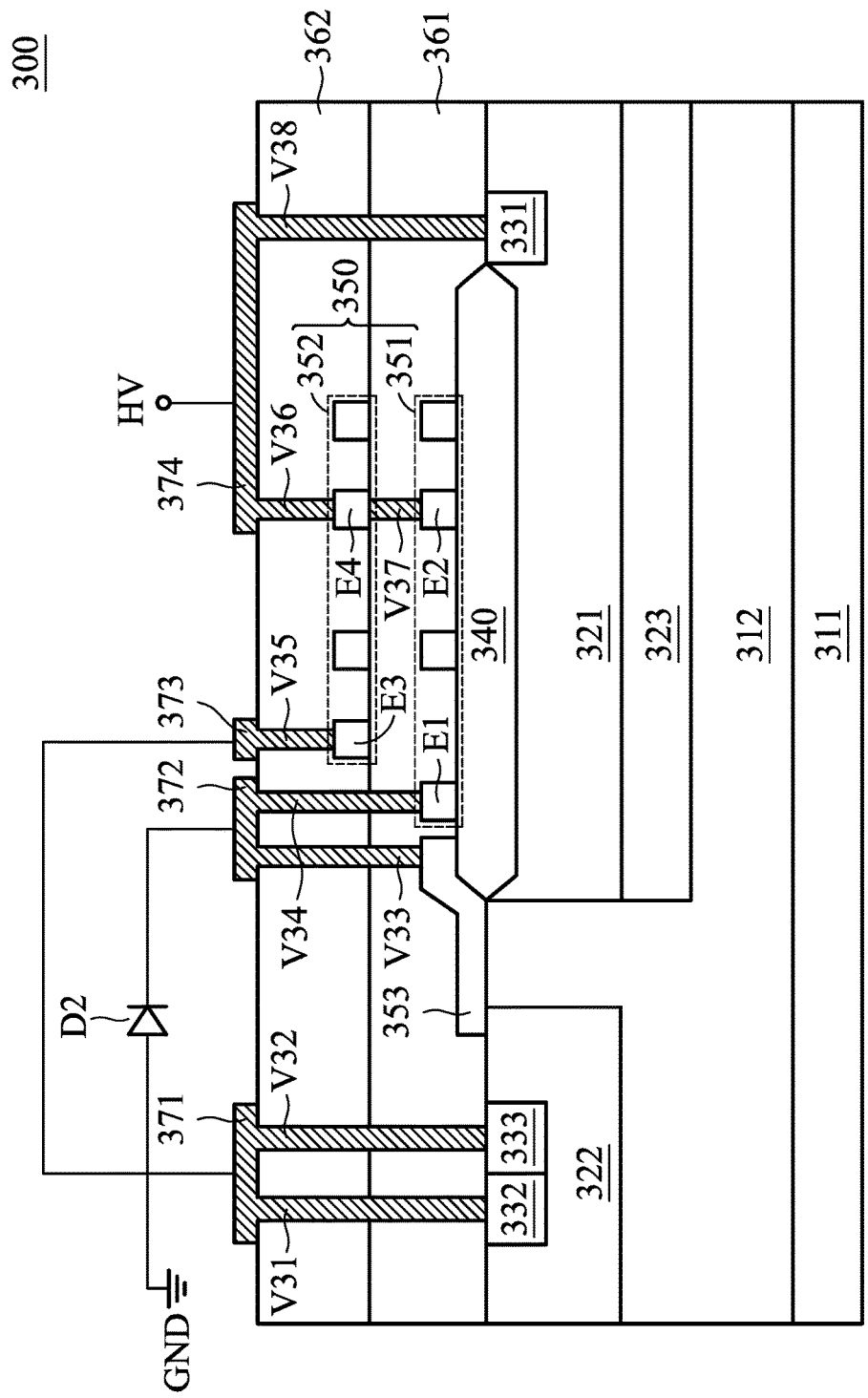
FIG. 3A is a schematic diagram of another exemplary embodiment of the semiconductor structure, according to various aspects of the present disclosure.

FIG. 3A is a schematic diagram of another exemplary embodiment of the semiconductor structure, according to various aspects of the present disclosure. The semiconductor structure 300 comprises a substrate 311, an epitaxial layer 312, wells 321~323, doped regions 331~333, a field oxide 340, a stack structure 350 and a gate 353. The substrate 311 has a first conductivity type. Since the features of the substrate 311 is the same as the features of the substrate 110 shown in FIG. 1A, the description of the substrate 310 is omitted. The epitaxial layer 312 is disposed in the substrate 311 and as the first conductivity type. In other embodiments, the epitaxial layer 312 can be omitted.

The wells 321~323 are formed in the epitaxial layer 312. In this embodiment, the well 321 is spaced apart from the well 322, and the well 321 is disposed in the well 323. In one embodiment, the epitaxial layer 312 may be formed by an epitaxial growth step. Next, wells 321~323 are extended into the epitaxial layer 312 sequentially by a doping process (e.g., ion implantation), and a thermal diffusion process. In other embodiments, the well 323 is a deep high-voltage well.

In this embodiment, each of the wells 321 and 323 has a second conductivity type, and the well 322 has the first conductivity type. In some embodiments, each of the wells 321~323 are formed by ion implantation. Taking the well 321 as an example, when the second conductivity type is N-type, the predetermined region for the well 321 may be implanted with phosphorous ions or arsenic ions to form the well 321. However, when the second conductivity type is P-type, the predetermined region for the well 321 may be implanted with boron ions or indium ions to form the well 321.

The doped region 331 is formed in the well 321 and has the second conductivity type. The doped regions 332 and 333 are formed in the well 322. The doped region 333 is disposed between the doped regions 331 and 332. In this embodiment, the doped region 332 has the first conductivity type, and the doped region 333 has the second conductivity type. In one embodiment, the doped regions 331~333 are formed by ion implantation. Taking the doped region 331 as an example, when the second conductivity type is N-type, the predetermined region for the doped region 331 may be implanted with phosphorous ions or arsenic ions to form the doped region 331. However, when the second conductivity type is P-type, the predetermined region for the doped region 331 may be implanted with boron ions or indium ions to form the doped region 331. In this embodiment, the dopant concentration of each of the doped regions 331 and 333 is higher than the dopant concentration of the well 321, and the dopant concentration of the doped region 332 is higher than the dopant concentration of the well 322.

The field oxide 340 is disposed on the substrate 311 and disposed between the doped regions 331 and 333. In this embodiment, the field oxide 340 is extended into the well 321. The field oxide 340 directly contacts the doped region 331, but the disclosure is not limited thereto. In other embodiments, the field oxide 340 is spaced apart from the doped region 331.

The stack structure 350 is formed on the field oxide 340 and contacts the field oxide 340. In this embodiment, the stack structure 350 comprises conductive layers 351 and 352 and an insulating layer 361, but the disclosure is not limited thereto. In other embodiments, the stack structure 350 may comprises any suitable number of the conductive layers and any suitable number of the insulating layers. Since the features of the stack structure 350 is the same as the features of the stack structure 150 shown in FIG. 1A, the description of the stack structure 350 is omitted. In one embodiment, the voltage levels of the conductive layers 351 and 352 are the same. Therefore, the capacitance of the equivalent capacitor formed by the conductive layer 351, the insulating layer 361 and the conductive layer 352 is about 0.

The gate 353 is formed over the substrate 311 and disposed between the doped regions 331 and 333. The gate 353 overlaps a portion of the field oxide 340 and a portion of the well 322. In this embodiment, the gate 353 and the conductive layer 351 are formed by the same manufacturing process, and the gate 353 is spaced apart from the conductive layer 351. In one embodiment, the materials of the gate 353 and the conductive layer 351 are the same. In this embodiment, the gate 353 and the doped regions 331~333 constitute a transistor, wherein the doped region 331 serves as the drain of the transistor, the doped region 332 serves as the bulk of the transistor, the doped region 333 serves as the source of the transistor.

In this embodiment, the semiconductor structure 300 further comprises an insulating layer 362. The insulating layer 362 is formed on the insulating layer 361 and the conductive layer 352. Since the features of the insulating layers 361 and 362 are the same as the features of the insulating layers 161 and 162 shown in FIG. 1A, the descriptions of the insulating layers 361 and 362 shown in FIG. 3A are omitted.

The semiconductor structure 300 further comprises conducting wires 371~374. The conducting wires 371~374 are formed on the insulating layer 362. The conducting wire 371 utilizes the vias V31 and V32 to electrically connect to the doped regions 332 and 333. In one embodiment, the conducting wire 371 is configured to transmit the ground level to the doped regions 332 and 333.

The conducting wire 372 utilizes the vias V33 and V34 to electrically connect to the gate 353 and the conductive terminal E1 of the conductive layer 351. In this embodiment, the conductive terminal E1 does not overlap the conductive terminal E3 of the conductive layer 352 such that the conducting wire 372 is conveniently connected to the conductive terminal E1. In other embodiments, the conductive terminal E1 may cover a portion of the conductive terminal E3. In one embodiment, the conducting wire 372 is further connected to a cathode of an external diode D2. In this case, the anode of the diode D2 may be coupled to the conducting wire 371.

The conducting wire 373 utilizes the via V35 to electrically connect to the conductive terminal E3 of the conductive layer 352. In one embodiment, the conducting wire 373 is configured to transmit the ground level GND to the conductive terminal E3. The conducting wire 374 utilizes the vias V36 and V37 to electrically connect to the conductive terminal E4 of the conductive layer 352 and the conductive terminal E2 of the conductive layer 351. Additionally, the conducting wire 374 utilizes the via V38 to electrically connect to the doped region 331. In one embodiment, the conducting wire 374 is configured to receive a high-voltage signal HV.

Figure 3B:
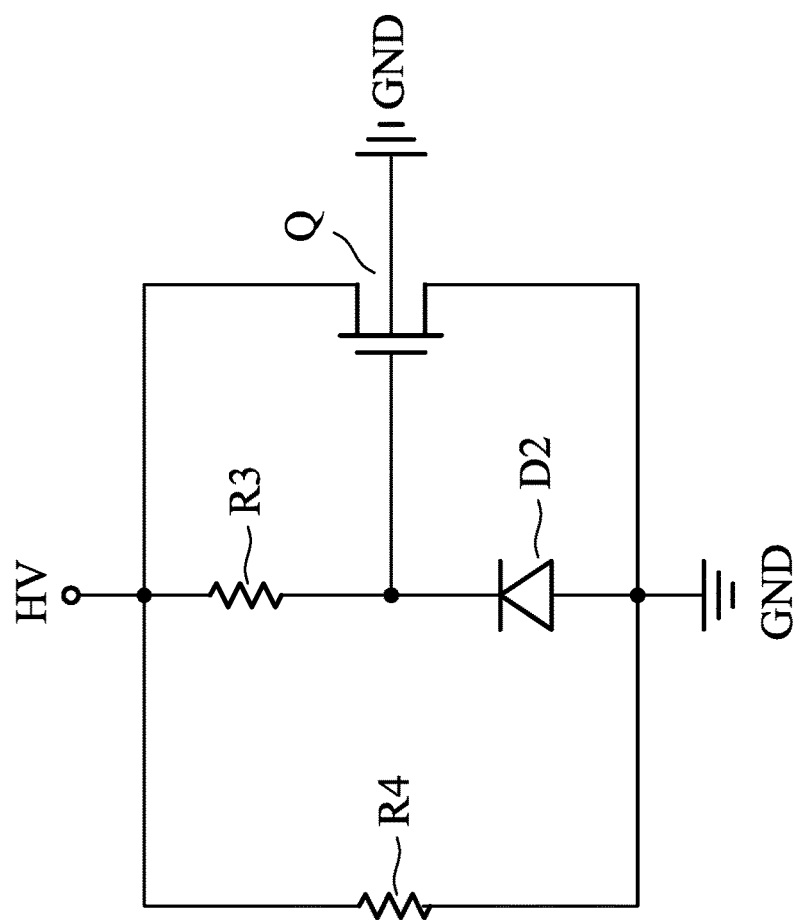
FIG. 3B is an equivalent circuit diagram of an exemplary embodiment of the semiconductor structure, according to an embodiment of the present invention.

FIG. 3B is an equivalent circuit of an exemplary embodiment of the semiconductor structure 300 according to an embodiment of the present invention. The semiconductor structure 300 provides a transistor Q and resistors R3 and R4. In this embodiment, the transistor Q comprises the gate 353 and the doped regions 331~333, wherein the doped region 331 serves as the drain of the transistor Q, the doped region 332 serves as the bulk of the transistor Q, and the doped region 333 serves as the source of the transistor Q. Furthermore, the resistor R3 is the equivalent resistor of the conductive layer 351. The resistor R4 is the equivalent resistor of the conductive layer 352. In this embodiment, the drain of the transistor Q receives the high-voltage signal HV and the transistor Q is coupled to the resistors R3 and R4 via the conducting wires 371~374. Additionally, the gate of the transistor Q is electrically connected to the resistor R3 and the cathode of the diode D2. The source and the bulk of the transistor Q receive the ground level GND.

In one embodiment, the diode D2 is disposed outside of the semiconductor structure 300. As shown in FIG. 3B, the cathode of the diode D2 is coupled to the gate of the transistor Q, and the anode of the diode D2 receives the ground level GND. In one embodiment, the diode D2 is a high-voltage element which is capable of sustaining high-voltage. In addition, since the resistor R3 is connected to the diode D2 in series, the transistor Q can be turned on fast. Furthermore, since the resistor R4 is coupled to the transistor Q in parallel, the leakage current passing through the transistor Q can be reduced. In this embodiment, the resistors R3 and R4, and the transistor Q are integrated into a semiconductor structure.

Figure 4A:
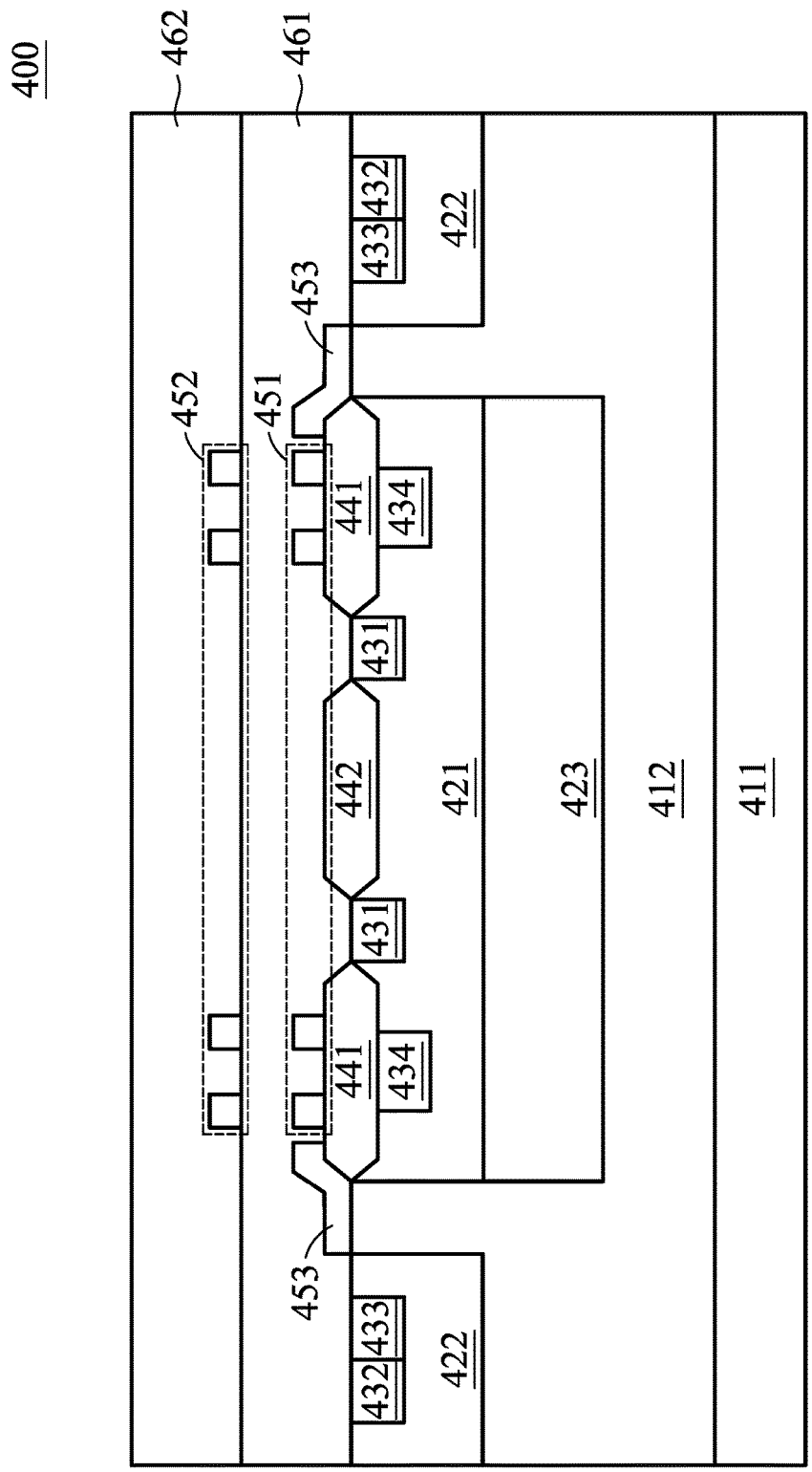
FIG. 4A is a schematic diagram of another exemplary embodiment of the semiconductor structure, according to various aspects of the present disclosure.

FIG. 4A is a schematic diagram of another exemplary embodiment of the semiconductor structure, according to various aspects of the present disclosure. FIG. 4A is similar to FIG. 3A with the exception that the semiconductor structure 400 comprises a field oxide 441. The field oxide 441 is extended along a ring path surrounding the field oxide 442 and the doped region 431. Additionally, the doped region 431 is extended along a ring path surrounding the field oxide 442. In this embodiment, each of the conductive layers 451 and 452 is extended along a helical-shaped path on the field oxide 441, but the disclosure is not limited thereto. The shapes of the extended paths of the conductive layers 451 and 452 may be the same or different, as long as the conductive layers 451 and 452 covers the field oxide 441. Since the features of the conductive layers 451 and 452 are the same as the features of the conductive layers 351 and 352, the descriptions of the conductive layers 451 and 452 are omitted. Additionally, since the features of the substrate 411, the epitaxial layer 412, the wells 421~423, the doped regions 431~433, the field oxide 441 and the gate 453 are the same as the features of the substrate 311, the epitaxial layer 312, the wells 321~323, the doped regions 331~333, the field oxide 340 and the gate 353 shown in FIG. 3A, the descriptions of the substrate 411, the epitaxial layer 412, the wells 421~423, the doped regions 431~433, the field oxide 441 and the gate 453 are omitted.

Figure 4B:
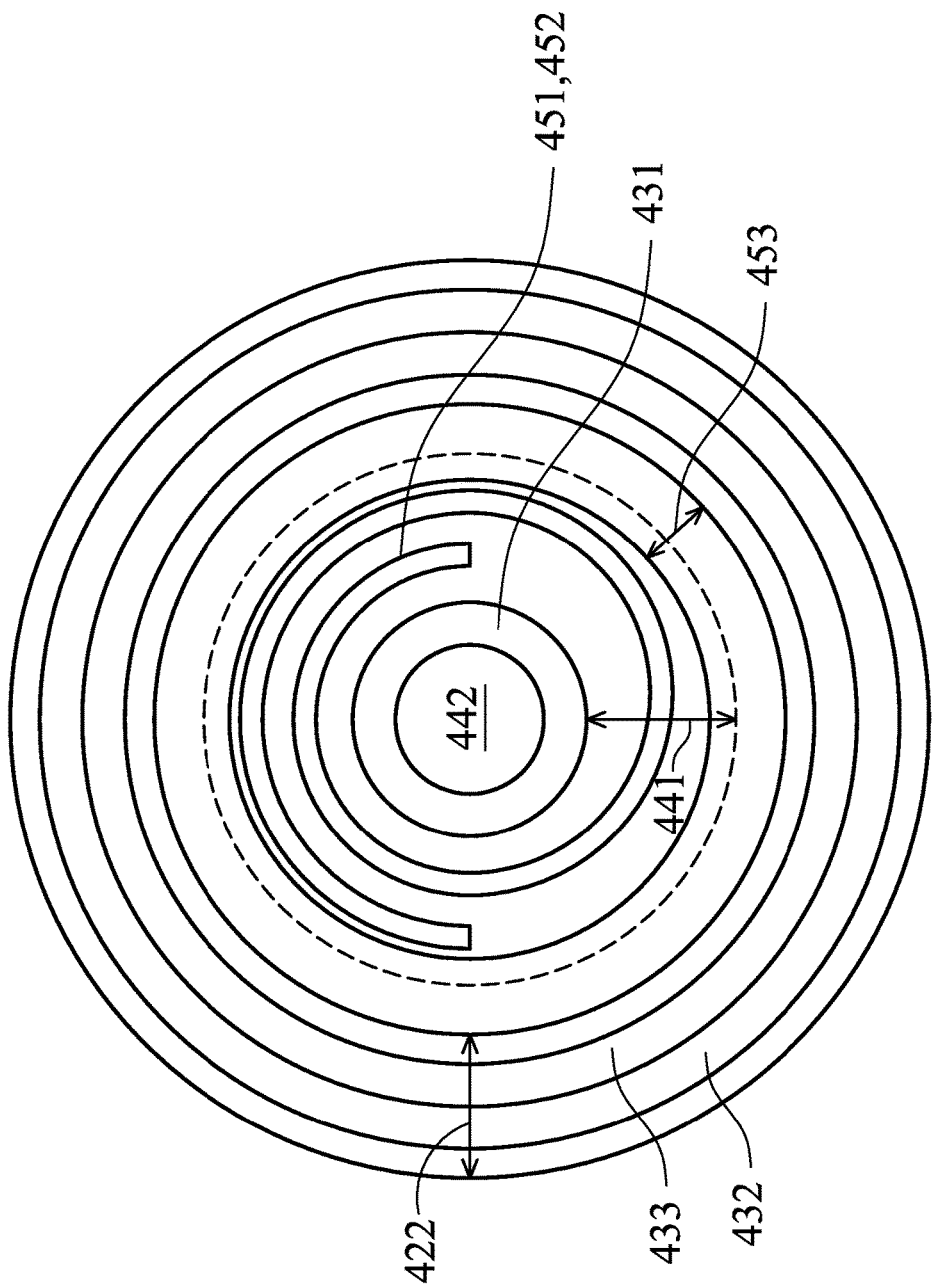
FIG. 4B is a plan view of exemplary embodiments of the semiconductor structure, according to an embodiment of the present invention.

FIG. 4B is a top-view of exemplary embodiments of the semiconductor structure 400 according to an embodiment of the present invention. The field oxide 442 is extended along a circular-shaped path. In this case, the doped region 431 is extended along a ring-shaped path ringing the field oxide 442. The field oxide 441 is extended along a ring-shaped path surrounding the doped region 431. In this embodiment, each of the conductive layers 451 and 452 is extended along a helical-shaped path overlapping the field oxide 441. The gate 453 is extended along a ring-shaped path surrounding the field oxide 441 and overlapping a portion of the field oxide 441. The well 422 is extended along a ring-shaped path ringing the gate 453. As shown in FIG. 4B, the doped region 433 disposed in the well 422 surrounds the gate 453. The doped region 432 disposed in the well 422 surrounds the doped region 433.

Figure 5A:
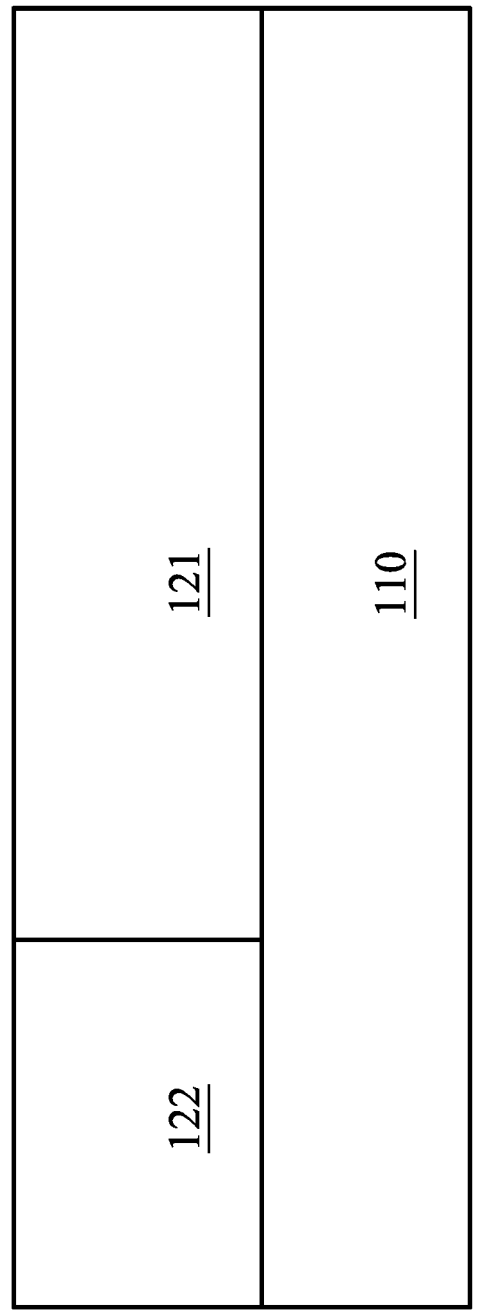
FIGS. 5A-5C are cross-sectional views of the semiconductor structure at various manufacturing stages in accordance with some embodiments of the present disclosure.
Figure 5B:
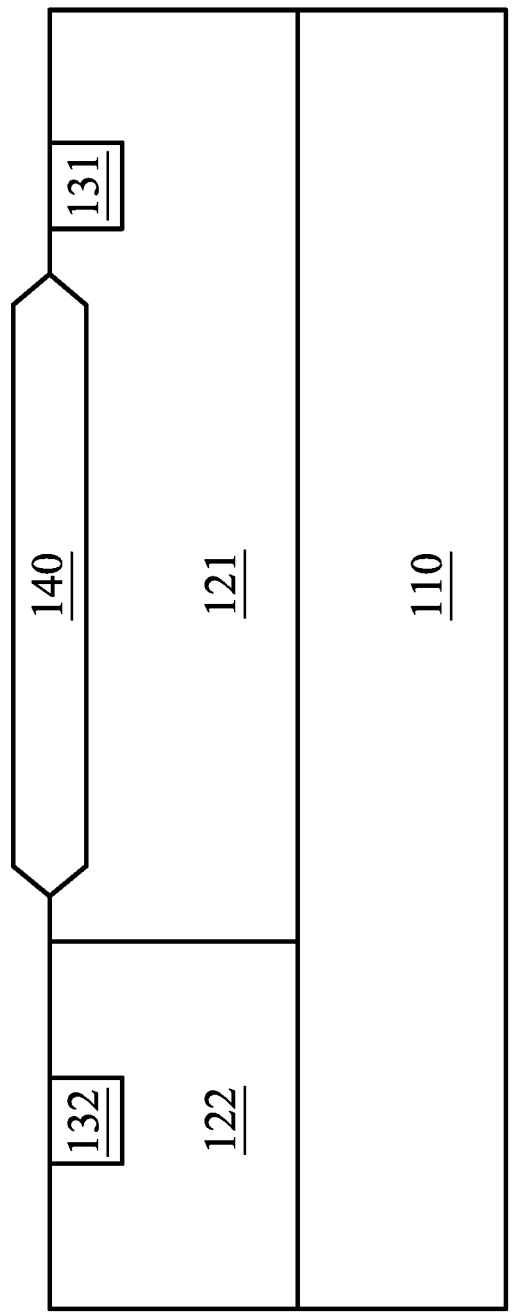
Figure 5C:
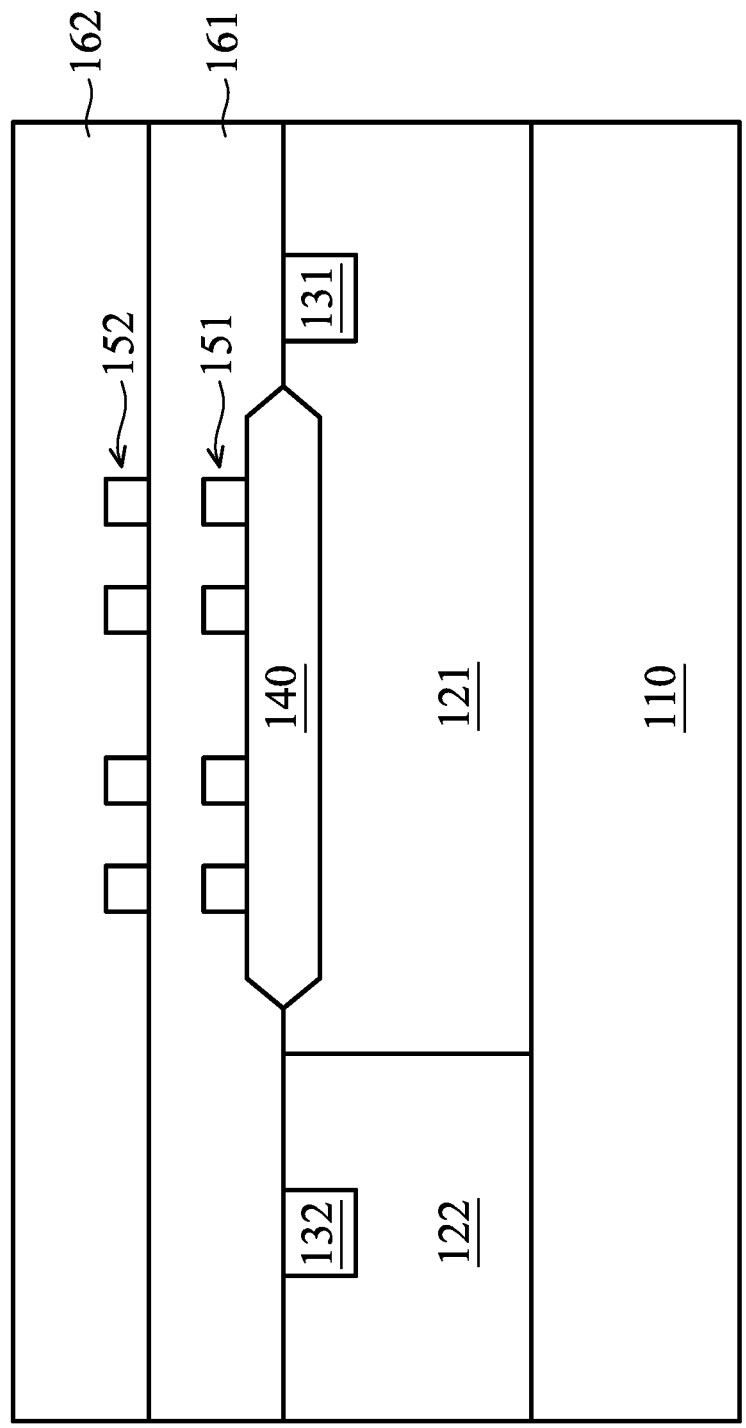

FIGS. 5A-5C are cross-sectional views of the semiconductor structure at various manufacturing stages in accordance with some embodiments of the present disclosure. Referring to FIG. 5A, a substrate 110, such as a silicon substrate, a silicon on insulator (SOI) substrate or another suitable semiconductor substrate, of a first conductivity type is provided. Next, wells 121 and 122 are formed in the predetermined regions of the substrate 110 sequentially by a doping process (e.g. ion implantation), and a thermal diffusion process. The conductivity type of the well 121 is different from the conductivity type of the substrate 110. The conductivity type of the well 122 is the same as the conductivity type of the substrate 110.

Referring to FIG. 5B, a doped region 131 is formed in the well 121 and a doped region 132 is formed in the well 122 by a doping process (e.g. ion implantation). In this embodiment, the conductivity type of the doped region 131 is the same as the conductivity type of the well 121, and the conductivity type of the doped region 132 is the same as of the conductivity type of the well 122. In one embodiment, the dopant concentration of the doped region 131 is higher than the dopant concentration of the well 121, and the dopant concentration of the doped region 132 is higher than the dopant concentration of the well 122. Additionally, one insulating structure (e.g. the field oxide 140) is formed on the substrate 110. In this embodiment, the field oxide 140 is extended into the well 121 and disposed between the doped regions 131 and 132.

Referring to FIG. 5C, a conductive layer 151 is formed on the field oxide 140. Then, an insulating layer 161 is formed on the conductive layer 151. Next, a conductive layer 152 is formed on the insulating layer 161 and then an insulating layer 162 is formed on the conductive layer 152. In this embodiment, the conductive layer 152 overlaps the conductive layer 151. In some embodiments, more conducting wires and more interconnection wires are formed in the semiconductor structure 100. Since the structures of the interconnection wires are not limited in the present disclosure, FIG. 5C does not show the structure of the interconnection wires, such as the conducting wires 171 and 172, and the vias V11~V16.

Figure 6A:
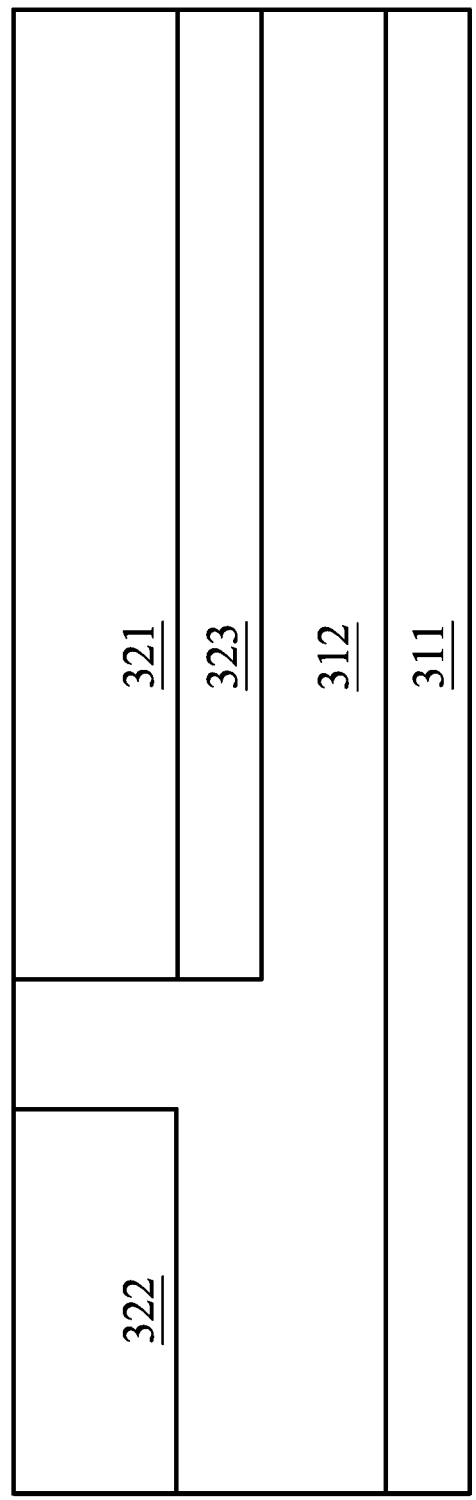
FIGS. 6A-6C are cross-sectional views of the semiconductor structure at various manufacturing stages in accordance with some embodiments of the present disclosure.
Figure 6B:
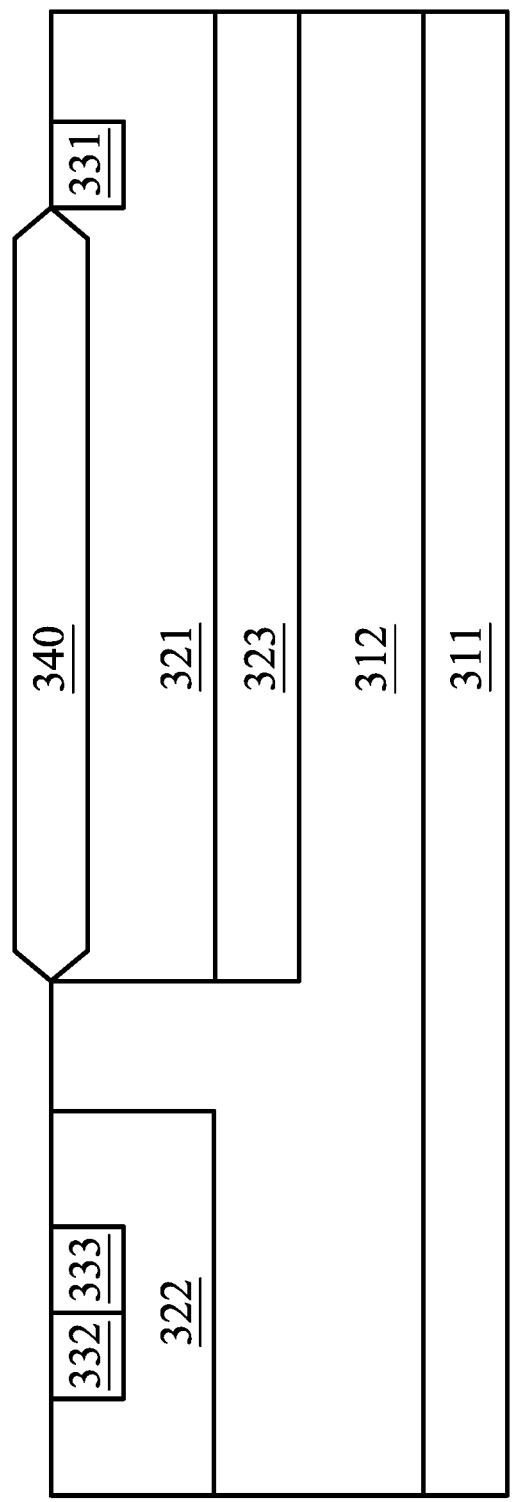
Figure 6C:
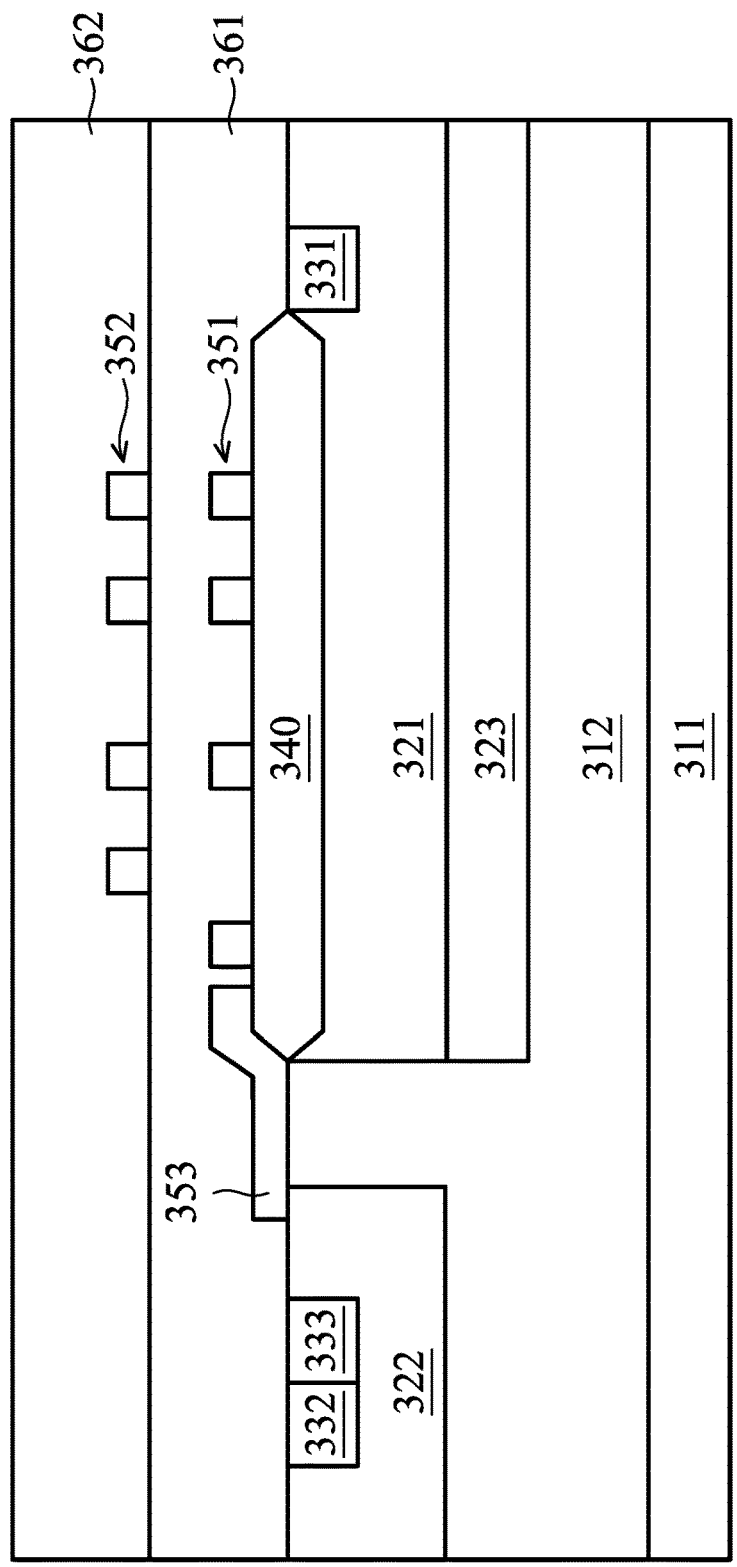

FIGS. 6A-6C are cross-sectional views of the semiconductor structure at various manufacturing stages in accordance with some embodiments of the present disclosure. Referring to FIG. 6A, a substrate 311, such as a silicon substrate, a silicon on insulator (SOI) substrate or another suitable semiconductor substrate, of a first conductivity type is provided. Next, an epitaxial layer 312 is formed on the substrate 311 and has the first conductivity type. The epitaxial layer 312 may be formed by an epitaxial growth step. Then, wells 323 and 322 are formed in the predetermined regions of the epitaxial layer 312 sequentially by a doping process (e.g. ion implantation), and a thermal diffusion process. The well 323 is a deep well and has a second conductivity type. The second conductivity type is different from the first conductivity type. The well 322 has the first conductivity type. Additionally, a well 321 is formed in the well 323. In this embodiment, the well 321 has the second conductivity type.

Referring to FIG. 6B, a doped region 331 is formed in the well 321, and doped regions 332 and 333 are formed in the well 322 by a doping process (e.g. ion implantation). In this embodiment, the conductivity type of each of the doped regions 331 and 333 is the same as the conductivity type of the well 321, and the conductivity type of the doped region 332 is the same as of the conductivity type of the well 222. In one embodiment, the dopant concentration of each of the doped regions 331 and 333 is higher than the dopant concentration of the well 321, and the dopant concentration of the doped region 332 is higher than the dopant concentration of the well 322. Additionally, one insulating structure (e.g. the field oxide 340) is formed on the substrate 311. In this embodiment, the field oxide 340 is extended into the well 321 and disposed between the doped regions 331 and 333.

Referring to FIG. 6C, a conductive layer 351 is formed on the field oxide 340. Additionally, a gate 353 is formed on the substrate 311. In this embodiment, the gate 353 overlaps a portion of the well 322 and a portion of the field oxide 340. In one embodiment, the gate 353 and the conductive layer 351 are produced by the same manufacturing process. However, the gate 353 is electrically isolated from the conductive layer 351. Then, an insulating layer 361 is formed on the conductive layer 351 and the gate 353. Next, a conductive layer 352 is formed on the insulating layer 361. In this embodiment, the conductive layer 352 covers the conductive layer 351, but the disclosure is not limited thereto. In other embodiments, the conductive layer 352 may cover a portion of the conductive layer 351. Then an insulating layer 362 is formed on the conductive layer 352. In the present disclosure, the connections between the conductive layers 351 and 352 and other structures (e.g. the doped regions 331~332 or the gate 353) are not limited. Therefore, FIG. 6C does not show the interconnection structures, such as the vias V31~V38 and the conducting wires 371~374 shown in FIG. 3A.

Since more conductive layers are formed on a field oxide, more resistors and at least one of the diodes or at least one of the transistors can be combined in the same semiconductor substrate. The number of the conductive layers relates to the number of resistors and the resistances of the resistors. Furthermore, the dopant concentration of the conductive layers and the shapes of the extended paths of the conductive layers relate to the resistances of the resistors. Additionally, the voltage levels of the conductive layers are adjusted such that the capacitances of the equivalent capacitors formed between conductive layers are approximately 0.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor structure, comprising:
    a substrate having a first conductivity type;
    a first well forming in the substrate and having a second conductivity type;
    a first doped region formed in the first well and having the second conductivity type;
    a second well formed in the substrate and having the first conductivity type;
    a second doped region formed in the second well and having the first conductivity type;
    a field oxide disposed on the substrate and disposed between the first and second doped regions;
    a first conductive layer overlapping the field oxide;
    a first insulating layer overlapping the first conductive layer; and
    a second conductive layer overlapping the first insulating layer,
    wherein the first conductive layer directly contacts the field oxide, and
    wherein a projection region of the field oxide on the substrate is completely within a projection region of the first well on the substrate.

2. The semiconductor structure as claimed in claim 1, wherein the first well is in contact with the second well.

3. The semiconductor structure as claimed in claim 1, wherein the shape of the first conductive layer is the same as or different from the shape of the second conductive layer.

4. The semiconductor structure as claimed in claim 1, wherein at least one of the first and second conductive layers is extended along a helical-shaped path.

5. The semiconductor structure as claimed in claim 1, wherein the first conductive layer comprises a first conductive terminal and a second conductive terminal, and the second conductive layer comprises a third conductive terminal and a fourth conductive terminal.

6. The semiconductor structure as claimed in claim 5, further comprising:
    a first conducting wire configured to transmit a ground level to the first conductive terminal, the third conductive terminal and the second doped region; and
    a second conducting wire configured to couple to the second conductive terminal, the fourth conductive terminal and the first doped region.

7. The semiconductor structure as claimed in claim 6, further comprising:
    a second insulating layer overlapping the second conductive layer, wherein the first and second conducting wire are disposed on the second insulating layer.

8. The semiconductor structure as claimed in claim 1, wherein the first conductivity type is P-type, and the second conductivity type is N-type.

9. The semiconductor structure as claimed in claim 1, wherein the first conductivity type is N-type, and the second conductivity type is P-type.

10. The semiconductor structure as claimed in claim 1, further comprising:
    an epitaxial layer disposed in the substrate and having the first conductivity type, wherein the first and second wells are disposed within the epitaxial layer.

11. The semiconductor structure as claimed in claim 1, wherein the first well is spaced apart from the second well.

12. The semiconductor structure as claimed in claim 11, further comprising:
   a third doped region disposed in the second well, disposed between the field oxide and the second doped region and having the second conductivity type; and
   a gate disposed on the substrate, disposed between the field oxide and the third doped region and overlapping a portion of the field oxide, wherein the gate, the first doped region and the third doped region constitute a transistor.

13. The semiconductor structure as claimed in claim 12, wherein the gate and the first conductive layer are produced by the same manufacturing process, and the gate is spaced apart from the first conductive layer.

14. The semiconductor structure as claimed in claim 12, wherein the first conductive layer comprises a first conductive terminal and a second conductive terminal, and the second conductive layer comprises a third conductive terminal and a fourth conductive terminal.

15. The semiconductor structure as claimed in claim 14, further comprising:
   a first conducting wire configured to couple to the second and third doped regions;
   a second conducting wire configured to couple to the gate and the first conductive terminal;
   a third conducting wire configured to couple to the third conductive terminal; and
   a fourth conducting wire configured to couple to the second conductive terminal, the fourth conductive terminal and the first doped region.

16. The semiconductor structure as claimed in claim 1, further comprising:
   a fourth doped region disposed in the first well, disposed under the field oxide and having the first conductivity type.

17. The semiconductor structure as claimed in claim 1, wherein the material of the first conductive layer is SiCr, metal or Poly.

* * * * *